(12) United States Patent
Schier

(10) Patent No.: US 7,294,884 B2
(45) Date of Patent: Nov. 13, 2007

(54) PASSIVATION OF POWER SEMICONDUCTOR DEVICE

(75) Inventor: Achim Schier, Hemsbach (DE)

(73) Assignee: IXYS Corporation, Santa Clara, CA (US)

( * ) Notice: Subject to any disclaimer, the term of this patent is extended or adjusted under 35 U.S.C. 154(b) by 90 days.

(21) Appl. No.: 11/095,921

(22) Filed: Mar. 30, 2005

(65) Prior Publication Data

US 2005/0230778 A1    Oct. 20, 2005

Related U.S. Application Data

(60) Provisional application No. 60/558,167, filed on Mar. 30, 2004.

(51) Int. Cl.
*H01L 29/72* (2006.01)
(52) U.S. Cl. .................. 257/328; 257/341; 257/401; 257/578
(58) Field of Classification Search ............ 257/341, 257/401, 578, 328, E29.257, E21.418
See application file for complete search history.

(56) References Cited

U.S. PATENT DOCUMENTS

| 2004/0009638 A1 | 1/2004 | Tanaka ........................ 438/202 |
| 2004/0084753 A1 | 5/2004 | Fruth et al. .................. 257/565 |
| 2006/0049406 A1 | 3/2006 | Amaratunga et al. ......... 257/66 |

*Primary Examiner*—Edward Wojciechowicz
(74) *Attorney, Agent, or Firm*—Townsend & Townsend & Crew LLP

(57) ABSTRACT

A vertical power semiconductor device comprises a substrate including a first layer that is a first conductivity type. A first conductive region is provided proximate an upper surface of the substrate, the first conductive region being a second conductivity type that is different from the first conductivity type. A first electrode is provided proximate the upper surface of the substrate and coupled to the first conductive region. A second electrode is provided proximate a lower surface of the substrate. A passivation structure including first and second dielectric layers provided over the upper surface of the substrate. One or more field plates of first type are provided between the first and second dielectric layers.

11 Claims, 3 Drawing Sheets

US 7,294,884 B2

PASSIVATION OF POWER SEMICONDUCTOR DEVICE

CROSS-REFERENCE TO RELATED APPLICATION

The present application claims priority to U.S. Provisional Application No. 60/558,167, filed on Mar. 30, 2004, which is incorporated by reference.

BACKGROUND OF THE INVENTION

The present invention relates to a power semiconductor device, in particular to vertical power devices with guard rings.

Power semiconductors are mostly used to switch high currents and high voltages in many applications. They have to be stable for a long time. Depending on the application, the devices have to switch frequently or only occasionally. The requirement for power devices generally is to have very low forward voltage drops in conduction mode and a very low leakage current in blocking mode.

Usually power semiconductor devices include n-type and p-type conductivity regions, metalized contact areas for current conduction and passivated areas configured to handle a given breakdown voltage.

Some power devices are configured to handle up to several thousand volts in blocking mode. As a result, the pn junctions in such devices produce very high electric fields which penetrate the surface of the devices. To withstand these blocking voltages, the power devices may be provided with special guard ring structures to reduce the electric fields stepwise.

Generally, the actual breakdown voltage is influenced by the design of the guard rings as well as the charges at the upper surface of the semiconductor substrate. The ions and charged particles in the insulating layers overlying the depletion region also negatively affect the breakdown voltage.

To obtain stable devices, the charges on the depleted zones should be time and temperature independent. Non-passivated depletion areas generally cannot be handled. Typically, the devices are mounted in plastic housings with potting materials (which includes glue or adhesion material). Such materials can be highly ion contaminated and/or may be polarized by the electric fields of the power devices. To protect the devices against these influences from the environment, they are covered with passivation layers on top of the depletion zones.

Also, ion contaminated glues should be kept away from the silicon surface, preferably as far as reasonably possible. Any coating or layer that is in direct contact with the silicon surface should be of very high purity in order not to degrade the breakdown voltage rating as well as for other reasons.

BRIEF SUMMARY OF THE INVENTION

The present invention relates to a vertical power semiconductor device with one or more guard rings. In one embodiment, the power device is provided with a multi-layer passivation structure having a PVD-glass in contact with a polyimide and a field plate provided between these two layers. In another embodiment, two types of field plates are provided in two different layers for bipolar power semiconductor devices, one type being provided between first and second dielectric layers and another type being provided between second and third dielectric layers.

In one embodiment, a vertical power semiconductor device comprises a substrate including a first layer that is a first conductivity type. A first conductive region is provided proximate an upper surface of the substrate, the first conductive region being a second conductivity type that is different from the first conductivity type. A first electrode is provided proximate the upper surface of the substrate and coupled to the first conductive region. A second electrode is provided proximate a lower surface of the substrate. A passivation structure including first and second dielectric layers provided over the upper surface of the substrate. One or more field plates of first type are provided between the first and second dielectric layers. The second dielectric layer is the uppermost layer of the device.

The device further includes an oxide layer provided between the substrate and the first dielectric layer; a plurality of field plates of second conductivity type provided between the oxide layer and the first dielectric layer; and a plurality of guard ring regions provided proximate the upper surface of the substrate. The plurality of field plates of second conductivity type includes third and fourth field plates, and the plurality of guard ring regions includes first and second guard ring regions, wherein the third and fourth field plates are coupled to the first and second guard ring regions, respectively, and wherein the third and fourth field plates are coupled to the first conductive region. The first and second dielectric layers are polyimide layers. The device is a discrete device, e.g., a single insulated gate bipolar transistor. The first and second guard ring regions define a ring that surrounds the first conductive region.

In another embodiment, a power device comprises an n-type substrate having an upper surface and a lower surface; first and second electrodes provided proximate the upper and lower surfaces, respectively; an emitter region coupled to the first electrode; a guard ring surrounding the emitter region; an oxide layer provided on the substrate; a dielectric layer provided on the oxide; a field plate provided on the dielectric layer and coupled to the guard ring; a polyimide layer provided on the field plate and the dielectric layer. The polyimide layer is the uppermost layer of the device and is configured to reduce arcing effects.

In another embodiment, a method of forming a power device is disclosed. The method includes providing an n-type substrate having an upper surface and a lower surface; providing first and second electrodes provided proximate the upper and lower surfaces, respectively; providing an emitter region coupled to the first electrode; providing a guard ring surrounding the emitter region; providing an oxide layer on the substrate; providing a first polyimide layer on the oxide layer; performing plasma activation on the first polyimide layer; and providing a second polyimide layer on the first polyimide, wherein the device includes a field plate between the first and second polyimide layers.

DETAILED DESCRIPTION OF THE INVENTION

The present embodiment of the present invention relates to passivation of vertical power semiconductor devices. The vertical power devices can be IGBTs, bipolar devices, and the like. In one implementation, the power devices are provided with a passivation structure having a plurality of layers, e.g., PVD-glass and polyimide, or polyimide and polyimide, or oxide and polyimide.

Figure 1:
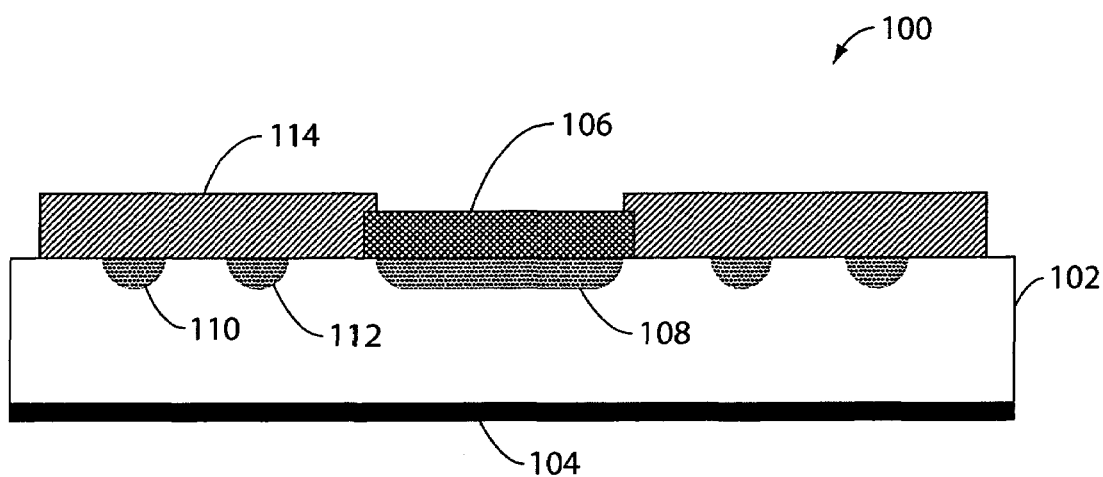
FIG. 1 illustrates a cross sectional view of a conventional power semiconductor device.

Many different materials are used for passivation, e.g., thermally-grown oxides, CVD oxides, polyimide, glass, CVD nitrides, or a combination thereof. FIG. 1 illustrates a power semiconductor device 100 that uses glass passivation. The device 100 is a vertical device that is configured to flow currents vertically through the substrate 102 from a contact metal 104 to a contact metal 106. The substrate is provided with a given conductivity, e.g., n-type. The substrate may include one or more layers, each with a different conductivity (e.g., an n− layer and n+ layer).

The power device 100 includes an emitter region 108 that is p-type, a plurality of guard rings 110, 112 that are p-type, and a passivation layer 114 made of glass.

To manufacture the device 100, the n-type and p-type regions are formed within the substrate. This involves growing an oxide layer on top of the substrate, which is silicon. Patterning the oxide to expose certain areas of the substrate and then providing dopants into the exposed area. The oxides are then removed. Glass powder is deposited on top of the silicon surface, e.g., by spraying, and firing the glass powder. The resulting glass layer is patterned to expose the silicon surface area wherein a metal contact is to be formed. This area overlies the emitter region. Metal is deposited on the exposed surface area and the glass, e.g., by e-beam method. The metal provided on the glass layer is thermally lifted off and sintered thereafter.

One disadvantage of this passivation technique is that the limitation in thickness of the glass is about 20 μm. Pin holes are generated at lower thickness, and large mechanical stress results at higher thickness. Due to the firing at 700° C. of the glass and the non-adapted thermal expansion coefficient, the substrate (wafer) bents at room temperature due to the resulting stress.

In the conventional designs with oxides, the glass or polyimide is not protection against electric influence caused by high electric fields. In case of using high temperature processes for the passivation the wafers or substrates will be mechanically stressed due to the poor adoption of the thermal expansion coefficient.

Figure 2:
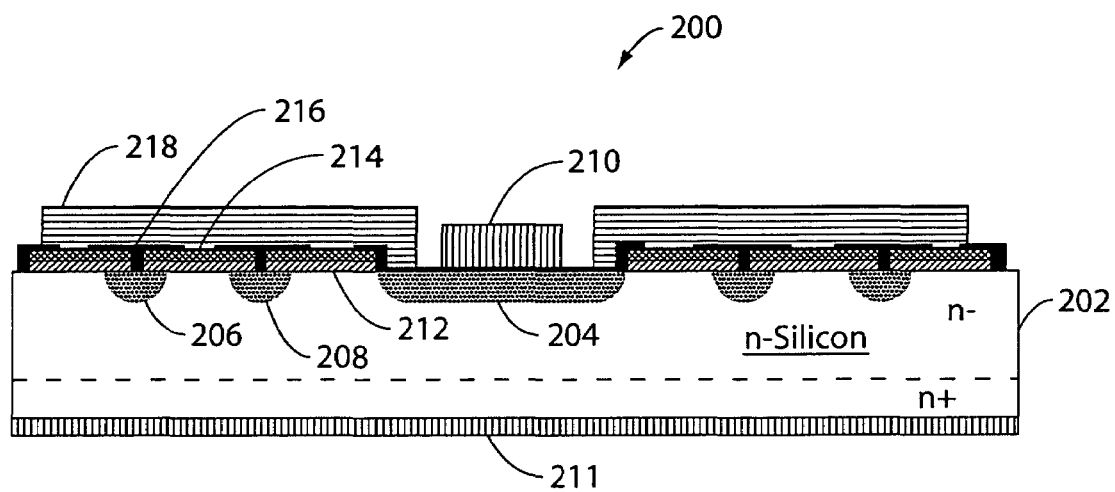
FIG. 2 illustrates a cross sectional view of a power semiconductor device of one embodiment of the present invention.

FIG. 2 illustrates a vertical power device 200 according to one embodiment of the present invention. The power device may be an IGBT, bipolar device or the like according to application. The device 200 includes a semiconductor substrate, e.g., silicon, 202, an emitter region 204, one or more guard rings 206, 208, a first contact metal 210 provided on the emitter region and on the upper surface of the substrate, and a second contact metal 211 provided on the backside of the substrate. The substrate includes one or more n-type layers. In one embodiment, the substrate may include an n− layer and an n+ layer. The emitter region and guard rings are p-type regions that are formed within the substrate and proximate the upper surface thereof.

The device 200 further includes an oxide layer 212 formed on the upper surface of the substrate, a glass layer 214 on the oxide, a plurality of field plates 216 on the glass, and a polyimide layer 218. Each field plate contacts the corresponding guard ring. The polyimide layer is provided on top the field plates but also contacts the glass layer 214 since the field plates are patterned and exposes the glass underneath. The polyimide layer is configured to prevent arcing between the adjacent field plates.

In the present embodiment, the thermally grown oxide that was used to form the diffused region is kept on the substrate for passivation purpose. On this oxide, a special ion free glass (technically ion free) is deposited by e-beam evaporation to form the glass layer 214.

The power device 200 is manufactured using the following process. N-type and p-type regions 204, 206, 208 are formed within the n-silicon substrate using conventional oxidation, masking and diffusion processes. The oxide is made to have a thickness of about 1.5 μm in this implementation. The oxide layer is patterned to expose the contact areas. The exposed contact areas are covered with photoresist.

Glass is deposited on the photoresist and the oxide layer. The glass layer is deposited using an physical vapor deposition method (PVD), e.g., e-beam glass evaporation. The glass is deposited to a thickness of 2 μm. The glass on the photoresist is chemically lifted off to expose the contact areas. A metal layer is deposited on the glass and the exposed contact areas. The metal layer is patterned to form the contact to the emitter and a plurality of field plates. A polyimide is deposited on the field plates and the glass layer to a thickness of about 15 μm. The polyimide is patterned. Thereafter, a contact metal is formed on the emitter region.

Using the above process, the device 200 is provided with a passivation structure that has total thickness of about 18 μm and has smoother surface than that obtained by the conventional spraying process. The passivation structure includes the PVD glass and the polyimide. The passivation structure may also include the oxide layer. The evaporation of the PVD glass takes place at low temperatures under 350° C., hence the thermal induced stress resulting from the mismatch of the thermal expansion coefficient is low.

The advantages of a power device with the passivation structure above are as follows. The passivation layer is provided with homogenous thickness and low intrinsic stress. As a result, the processed wafers are less likely to bow or bend. The glass layer formed by evaporation is more homogenous compared to that formed by spraying and has less holes that result from vacuum evaporation. The field plates, made of metal or other conducting layers, can be included in the design. These plates partially cover the glass and oxide, so that the passivation beneath the field plates is protected against ionic contamination by the field plates.

Figure 3A:
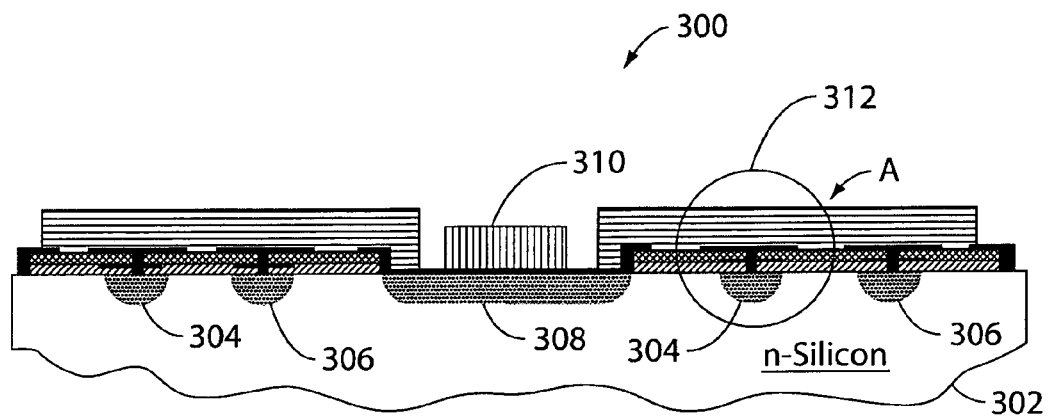
FIG. 3A illustrates a vertical power semiconductor device with a passivation structure including a plurality of films or layers according to one embodiment of the present invention.

FIG. 3A illustrates a vertical power semiconductor device 300 with a passivation structure including a plurality of films or layers according to one embodiment of the present invention. The device 300 includes a semiconductor substrate 302, one or more guard rings 304, 306, and an emitter region 308. A first contact metal 310 is formed on the emitter region. A second contact metal (not shown) is provided on the other side of the substrate, so that the currents flow vertically between these metals.

The substrate is silicon and provided with n-type dopants in the present embodiment. The substrate may include a plurality of layers, e.g., an n− layer and an n+ layer. The n− layer may be an epi layer. The guard rings and emitter are provided proximate the upper surface of the substrate and configured to have opposing conductivity than that of the substrate. In the present embodiment, the guard rings and emitter are p-type regions.

Figure 3B:
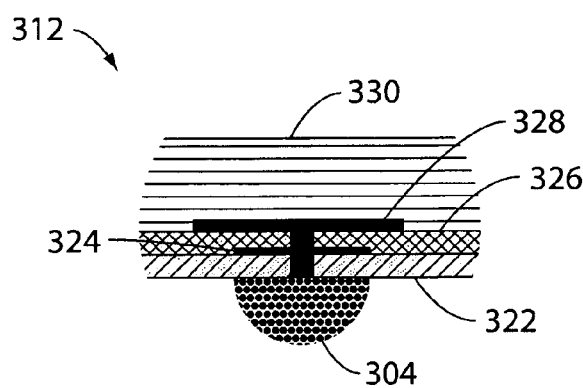
FIG. 3B illustrates an enlarge view of a section of the power device of FIG. 3A.

FIG. 3B illustrates an enlarge view of a section 312 of the device 300. An oxide layer 322 is provided on the substrate. A first field plate 324 is formed on the oxide. A PVD-glass layer 326 is formed on the oxide and the first field plate. A second field plate 328 is formed on the glass layer. A polyimide layer 330 is formed on the second field plate and the glass layer. In other implementation, the glass layer 326 may be of other dielectric materials than glass, e.g., another polyimide or CVD-oxide. In the present embodiment, polyimide is deposited on the PVD glass since the elasticity of polyimide is much higher than of PVD glass. If PVD glass is provided on polyimide, the PVD glass will crack.

The power device 300 is provided with two different types of field plates, the first field plates 324 and the second field plates 328. The first field plate is configured to push down the electric field and increase the breakdown voltage of the device. The second field plate is configured to reduce the areas of the glass layer 326 that are not covered by metal. The metal (or conductive material) removes ions in the glass layer and reduces the ion contamination of the glass layer.

The polyimide layer 330 protects the underlying glass layer 326 against ion contamination. These field plates have a potential difference since they contact the corresponding guard rings. If the potential difference is significant, then arcing may result. Arcing is a serious concern particularly when dealing with high breakdown voltages, e.g., 1700 volts. The breakdown voltage of polyimide is much higher than that of an unprotected surface and is able to withstand a significant voltage drop.

In the present embodiment, the glass that is used for the layer 326 is alkali ionic free glass. The resulting dielectric layer 326, accordingly, has very low ionic contamination. This keeps the breakdown voltage high. The electric field strength at the surface of the passivation is defined by the following equation: $E=Q/(4*Pi*E0*ER*d^2)$, where Q=charge, Pi=3,1415, E0=the dielectric constant in vacuum; ER=dielectric constant of the material, and d=the distance from the surface. As shown, the electric field strength decreases exponentially with the increase in distance. Accordingly, the passivation material that is provided at close proximity to the surface of the substrate needs to be substantially free of impurities, e.g., have very low ionic contamination, if high breakdown voltage is to be maintained. The field plates are also used to keep the electric field inside the substrate and increase the breakdown voltage.

The section 312 shows of the passivation structure, guard ring, and field plates. The passivation structure includes the oxide, glass, and polyimide layers. The thickness of each layer depends on the individual design of each device.

Figure 4A:
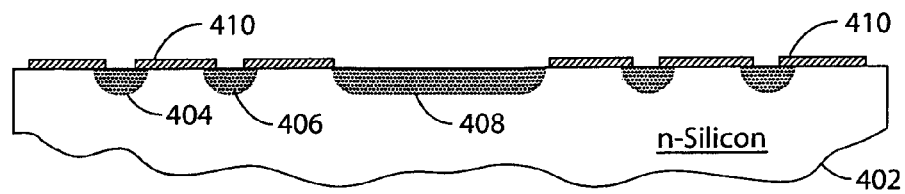
FIGS. 4A-4E illustrate a process for manufacturing a power semiconductor device with a multi-layer passivation structure according to one embodiment of the present invention.

FIGS. 4A-4E illustrate a process for manufacturing a power semiconductor device with a multi-layer passivation structure according to one embodiment of the present invention. Guard rings 404, 406 and emitter region 408 are to be formed on the upper surface of a substrate 402. An oxide layer 410 is formed and patterned to expose the guard rings and emitter (FIG. 4A). The oxide 410 is provided to have a thickness of 1-2 µm.

Figure 4B:
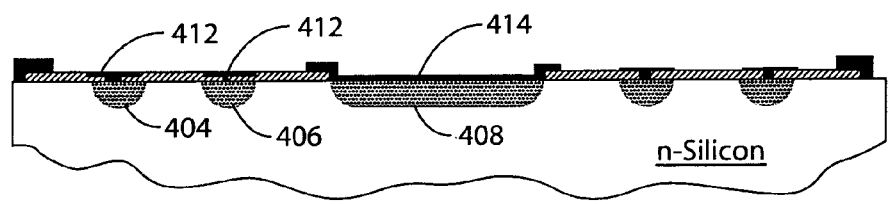
Figure 4C:
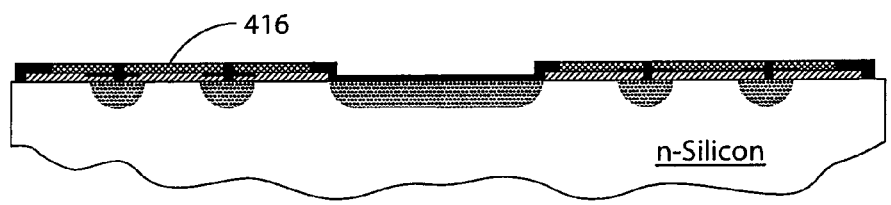

A first metal film or layer is deposited to a thickness of 0.5-3 µm on the oxide 410 and the exposed areas (FIG. 4B). The metal is deposited by physical vapor deposition (PVD). The metal film is patterned. The resulting metal structures form first field plates 412 that contact the corresponding guard rings and a metal electrode 414 that contacts the emitter 408. Each of the first field plates is also coupled to the emitter. A dielectric layer 416, e.g., glass layer, is deposited over the first field plates and the oxide (FIG. 4C). Glass is deposited to 2-7 µm thickness using e-beam glass evaporation method.

Figure 4D:
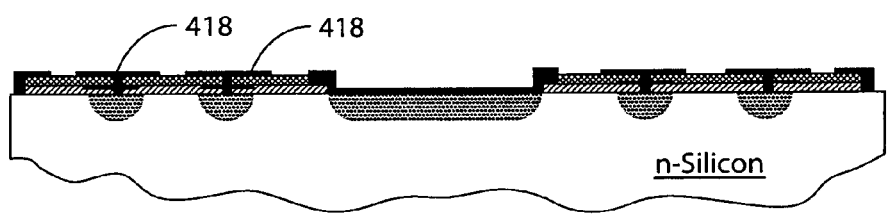
Figure 4E:
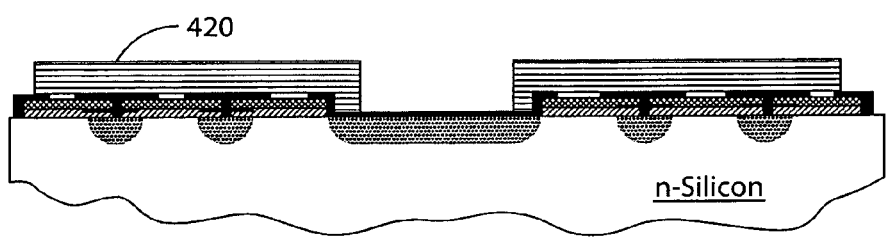

A second metal film or layer is deposited over the glass layer to 0.5-3 µm and then patterned to form second field plates 418 (FIG. 4D). Each of the second field plates is coupled to the corresponding guard ring, but is otherwise allowed to float. A polyimide layer 420 is deposited over the glass 416 and the second field plates (FIG. 4E). The polyimide layer is deposited to a thickness of 2-15 µm in the present embodiment. The polyimide is photosensitive material and is patterned to expose the area overlying the emitter region using photolithography methods. Thereafter a first contact metal (not shown) is formed over the emitter and proximate the upper surface of the substrate. A second contact metal (not shown) is formed on the lower surface of the substrate.

In one implementation, two different polyimide layers maybe used to form the passivation structure, so that a first polyimide layer is formed on the oxide layer 410 and the first field plates. A second field plates are then formed. Thereafter, a second polyimide layer is formed over the first polyimide and the second field plates. The first and second polyimide layers are, therefore, contacting each other. Such a structure has not been used as part of a passivation structure since the adhesion between polyimide layers is poor. The inventor has discovered, however, that the adhesive characteristic is significantly improved by performing a plasma activation on the first polyimide layer and then depositing the second polyimide thereafter. The plasma activation includes exposing the first polyimide to plasma generated from oxygen.

The present invention is described in terms of specific embodiments. The embodiments described may be modified or altered without departing from the scope of the present invention. For example, a passivation structure uses a polyimide layer on a CVD-oxide layer rather than a polyimide on a PVD-glass layer. Accordingly, the scope of the present invention is defined by the appended claims.

What is claimed is:

1. A vertical power semiconductor device, comprising:

a substrate including a first layer that is a first conductivity type;

a first conductive region provided proximate an upper surface of the substrate, the first conductive region being a second conductivity type that is different from the first conductivity type;

first and second electrodes, the first electrode being proximate the upper surface of the substrate and coupled to the first conductive region, the second electrode being proximate a lower surface of the substrate;

a passivation structure including first and second dielectric layers provided over the upper surface of the substrate;

one or more field plates of a first type provided between the first and second dielectric layers;

an oxide layer provided between the first dielectric layer and the upper surface of the substrate;

second and third conductive regions provided proximate the upper surface of the substrate, the second and third conductive regions being provided on opposing ends of the first conductive region, each of the second and third conductive regions being the second conductivity type, wherein the one or more field plates of the first type includes first and second field plates, the first field plate coupling the second conductive region, the second field plate coupling the third conductive region.

2. The device of claim 1, wherein the first conductive region is an emitter region, and the second and third conductive regions are guard ring regions, and the first dielectric layer is a glass layer, and the second dielectric layer is a polyimide layer.

3. A vertical power semiconductor device, comprising:
a substrate including a first layer that is a first conductivity type;
a first conductive region provided proximate an upper surface of the substrate, the first conductive region being a second conductivity type that is different from the first conductivity type;
first and second electrodes, the first electrode being proximate the upper surface of the substrate and coupled to the first conductive region, the second electrode being proximate a lower surface of the substrate;
a passivation structure including first and second dielectric layers provided over the upper surface of the substrate; and
one or more field plates of a first type provided between the first and second dielectric layers,
wherein the first and second dielectric layers are polyimide layers.

4. A vertical power semiconductor device, comprising:
a substrate including a first layer that is a first conductivity type;
a first conductive region provided proximate an upper surface of the substrate, the first conductive region being a second conductivity type that is different from the first conductivity type;
first and second electrodes, the first electrode being proximate the upper surface of the substrate and coupled to the first conductive region, the second electrode being proximate a lower surface of the substrate;
a passivation structure including first and second dielectric layers provided over the upper surface of the substrate, the second dielectric layer substantially covering the upper surface of the substrate; and
one or more field plates of a first type provided between the first and second dielectric layers,
wherein the second dielectric layer is the uppermost layer of the device,
wherein the first and second dielectric layers are polyimide layers.

5. A vertical power semiconductor device, comprising:
a substrate including a first layer that is a first conductivity type;
a first conductive region provided proximate an upper surface of the substrate, the first conductive region being a second conductivity type that is different from the first conductivity type;
first and second electrodes, the first electrode being proximate the upper surface of the substrate and coupled to the first conductive region, the second electrode being proximate a lower surface of the substrate;
a passivation structure including first and second dielectric layers provided over the upper surface of the substrate;
one or more field plates of a first type provided between the first and second dielectric layers;

an oxide layer provided between the substrate and the first dielectric layer;
a plurality of field plates of a second type provided between the oxide layer and the first dielectric layer; and
a plurality of guard ring regions provided proximate the upper surface of the substrate,
wherein the plurality of field plates of the second type includes third and fourth field plates, and the plurality of guard ring regions includes first and second guard ring regions,
wherein the third and fourth field plates are coupled to the first and second guard ring regions, respectively,
wherein the third and fourth field plates are coupled to the first conductive region,
wherein the first and second dielectric layers are glass and polyimide layers, respectively, or are oxide and polyimide layers, respectively, and
wherein the first and second dielectric layers are polyimide layers, and the device is a single insulated gate bipolar transistor.

6. A power device, comprising:
an n-type substrate having an upper surface and a lower surface;
first and second electrodes provided proximate the upper and lower surfaces, respectively;
an emitter region coupled to the first electrode;
a guard ring surrounding the emitter region;
an oxide layer provided on the substrate;
a dielectric layer provided on the oxide;
a field plate provided on the dielectric layer and coupled to the guard ring;
a polyimide layer provided on the field plate and the dielectric layer.

7. The power device of claim 6, wherein the dielectric layer is a glass layer that is formed using a physical vapor deposition method.

8. The power device of claim 6, wherein the dielectric layer is an oxide layer or another polyimide layer.

9. The power device of claim 7, wherein the polyimide layer is the uppermost layer of the device and is configured to reduce arcing effects.

10. The power device of claim 6, further comprising:
another field plate provided between the oxide layer and the dielectric layer and coupling the guard ring and the emitter.

11. A method of forming a power device, comprising:
providing an n-type substrate having an upper surface and a lower surface;
providing first and second electrodes provided proximate the upper and lower surfaces, respectively;
providing an emitter region coupled to the first electrode;
providing a guard ring surrounding the emitter region;
providing an oxide layer on the substrate;
providing a first polyimide layer on the oxide layer;
performing plasma activation on the first polyimide layer; and
providing a second polyimide layer on the first polyimide,
wherein the device includes a field plate between the first and second polyimide layers.

* * * * *